United States Patent
Lim et al.

(10) Patent No.: US 9,136,144 B2
(45) Date of Patent: Sep. 15, 2015

(54) METHOD OF FORMING PROTECTIVE MATERIAL BETWEEN SEMICONDUCTOR DIE STACKED ON SEMICONDUCTOR WAFER TO REDUCE DEFECTS DURING SINGULATION

(75) Inventors: TaegKi Lim, Kyounggi (KR); JaEun Yun, Kyounggi (KR); SungYoon Lee, Kyounggi (KR)

(73) Assignee: STATS ChipPAC, Ltd., Singapore (SG)

( * ) Notice: Subject to any disclaimer, the term of this patent is extended or adjusted under 35 U.S.C. 154(b) by 1065 days.

(21) Appl. No.: 12/617,877

(22) Filed: Nov. 13, 2009

(65) Prior Publication Data

US 2011/0115070 A1   May 19, 2011

(51) Int. Cl.
*H01L 21/44* (2006.01)
*H01L 21/48* (2006.01)
(Continued)

(52) U.S. Cl.
CPC .......... *H01L 21/563* (2013.01); *H01L 21/6836* (2013.01); *H01L 23/49827* (2013.01); *H01L 23/49838* (2013.01); *H01L 24/14* (2013.01); *H01L 24/81* (2013.01); *H01L 24/94* (2013.01); *H01L 25/0657* (2013.01); *H01L 23/3121* (2013.01); *H01L 23/481* (2013.01); *H01L 24/13* (2013.01); *H01L 24/97* (2013.01); *H01L 2221/68359* (2013.01); *H01L 2224/131* (2013.01); *H01L 2224/13099* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/16235* (2013.01); *H01L 2224/32145* (2013.01); *H01L 2224/32225* (2013.01); *H01L 2224/48091* (2013.01); *H01L 2224/73203* (2013.01); *H01L 2224/73204* (2013.01); *H01L 2224/73265* (2013.01); *H01L 2224/83102* (2013.01); *H01L 2224/92125* (2013.01);
(Continued)

(58) Field of Classification Search
USPC .................................. 257/E21.599; 438/114
See application file for complete search history.

(56) References Cited

U.S. PATENT DOCUMENTS 6,060,373 A * 5/2000 Saitoh ........................... 438/459
6,908,784 B1 * 6/2005 Farnworth et al. ............ 438/106
(Continued)

FOREIGN PATENT DOCUMENTS

CN            101211793 A       7/2008

*Primary Examiner* — Howard Weiss
(74) *Attorney, Agent, or Firm* — Robert D. Atkins; Patent Law Group: Atkins and Associates, P.C.

(57) ABSTRACT

A semiconductor wafer contains first semiconductor die. TSVs are formed through the semiconductor wafer. Second semiconductor die are mounted to a first surface of the semiconductor wafer. A first tape is applied to on a second surface of the semiconductor wafer. A protective material is formed over the second die and first surface of the wafer. The protective material can be encapsulant or polyvinyl alcohol and water. The wafer is singulated between the second die into individual die-to-wafer packages each containing the second die stacked on the first die. The protective material protects the wafer during singulation. The die-to-wafer package can be mounted to a substrate. A build-up interconnect structure can be formed over the die-to-wafer package. The protective material can be removed. Underfill material can be deposited beneath the first and second die. An encapsulant is deposited over the die-to-wafer package.

25 Claims, 15 Drawing Sheets

(51) Int. Cl.
  H01L 21/50 (2006.01)
  H01L 21/56 (2006.01)
  H01L 21/683 (2006.01)
  H01L 23/498 (2006.01)
  H01L 25/065 (2006.01)
  H01L 23/31 (2006.01)
  H01L 23/48 (2006.01)
  H01L 23/00 (2006.01)

(52) U.S. Cl.
  CPC ... *H01L2224/97* (2013.01); *H01L 2225/06572* (2013.01); *H01L 2924/014* (2013.01); *H01L 2924/0105* (2013.01); *H01L 2924/01006* (2013.01); *H01L 2924/01013* (2013.01); *H01L 2924/01022* (2013.01); *H01L 2924/01029* (2013.01); *H01L 2924/01032* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/10252* (2013.01); *H01L 2924/10253* (2013.01); *H01L 2924/10272* (2013.01); *H01L 2924/10329* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/18161* (2013.01); *H01L 2924/19011* (2013.01); *H01L 2924/19041* (2013.01); *H01L 2924/19043* (2013.01); *H01L 2924/19103* (2013.01); *H01L 2924/30105* (2013.01)

(56) References Cited

U.S. PATENT DOCUMENTS

| | | |
|---|---|---|
| 7,553,752 B2 | 6/2009 | Kuan et al. |
| 7,727,875 B2 * | 6/2010 | Shin et al. ............ 438/613 |
| 7,948,095 B2 * | 5/2011 | Ng et al. ............ 257/790 |
| 2006/0205182 A1 * | 9/2006 | Soejima ............ 438/460 |
| 2008/0318396 A1 | 12/2008 | Shin et al. |
| 2009/0127686 A1 | 5/2009 | Yang et al. |
| 2009/0200662 A1 | 8/2009 | Ng et al. |

\* cited by examiner

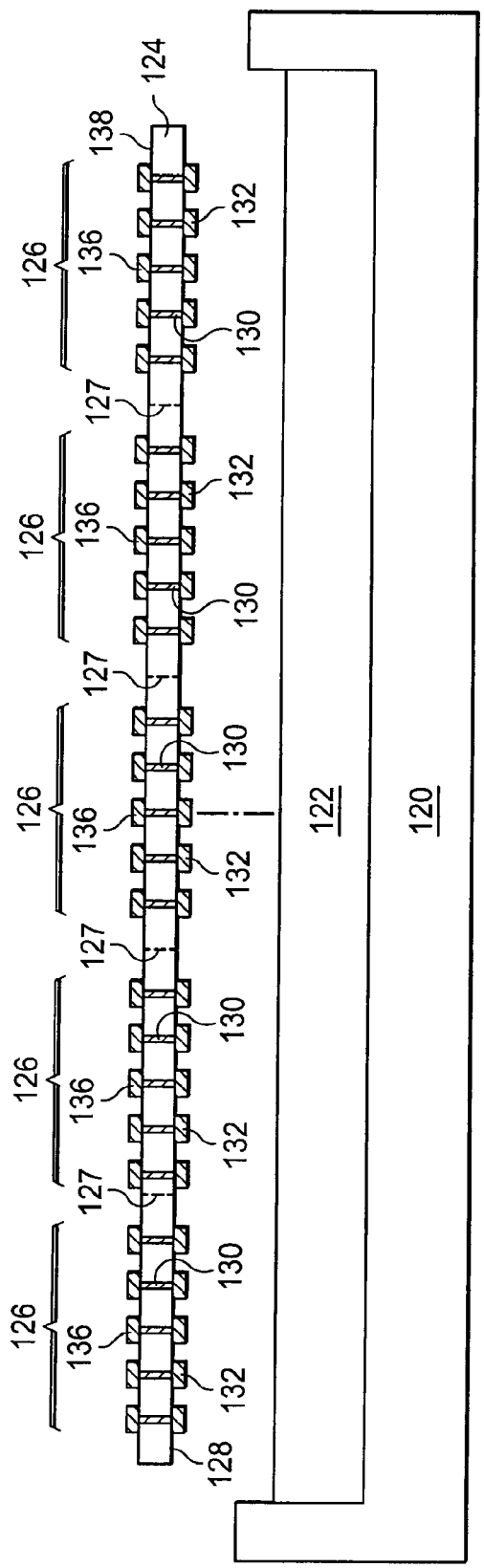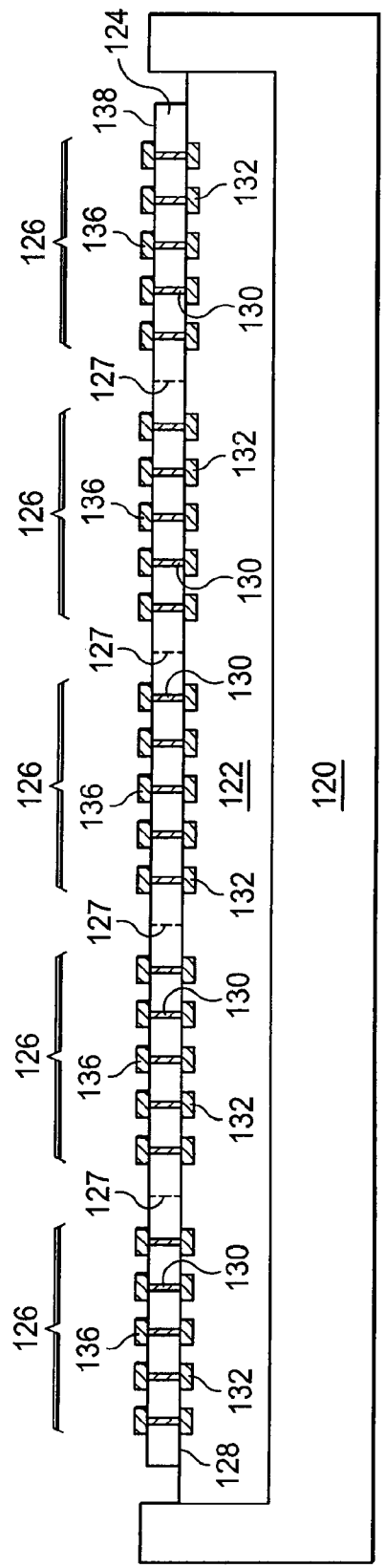
FIG. 3a
FIG. 3b

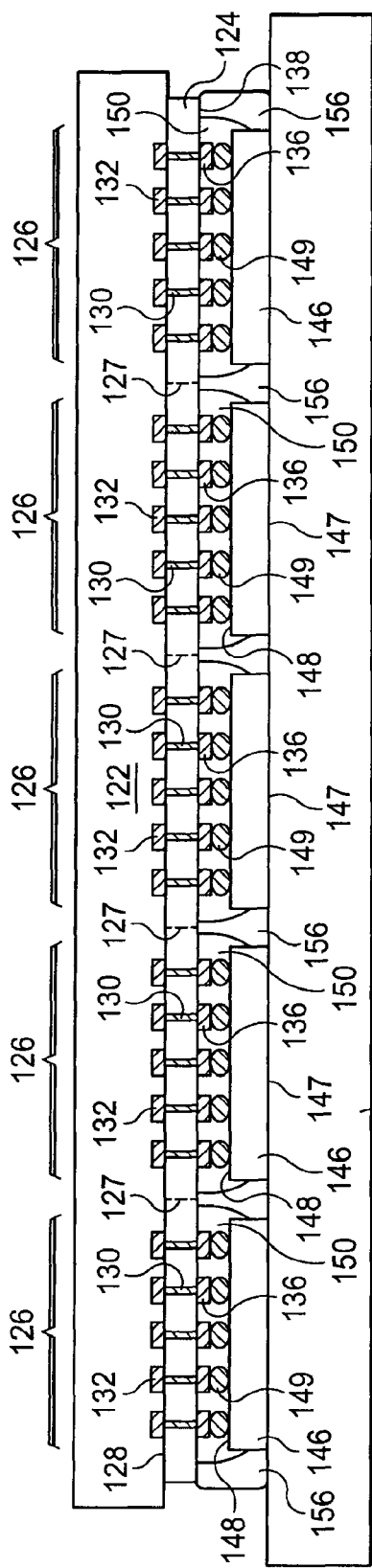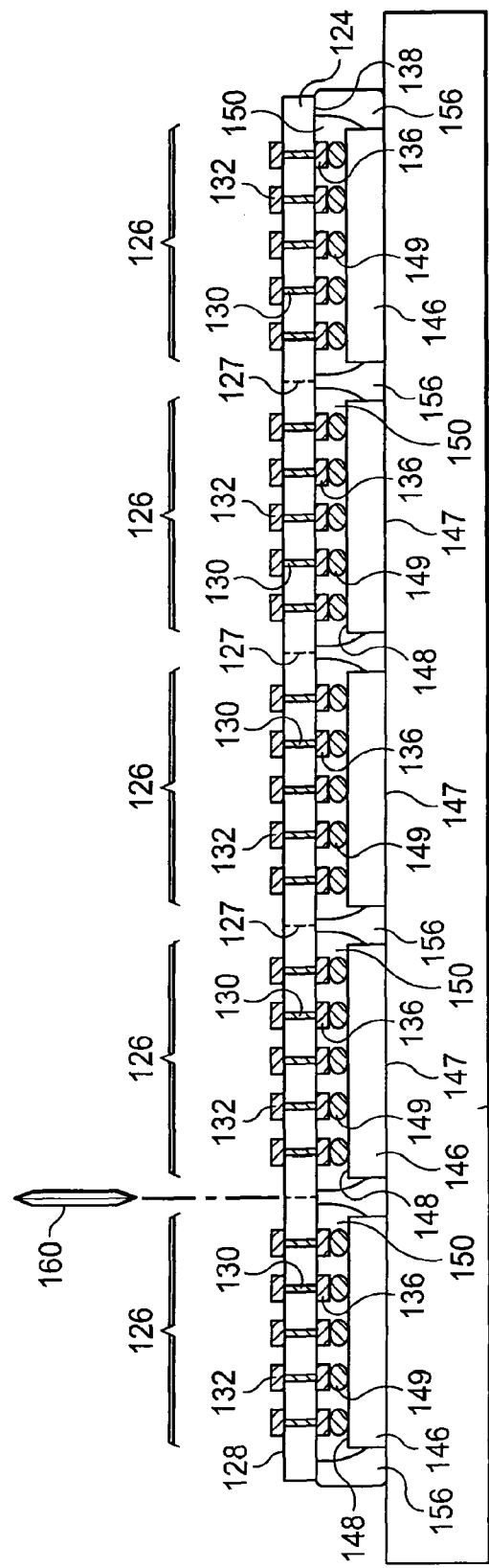

ated semiconductor devices include microcontrollers, microprocessors, charged-coupled devices (CCDs), solar cells, and digital micro-mirror devices (DMDs).

METHOD OF FORMING PROTECTIVE MATERIAL BETWEEN SEMICONDUCTOR DIE STACKED ON SEMICONDUCTOR WAFER TO REDUCE DEFECTS DURING SINGULATION

FIELD OF THE INVENTION

The present invention relates in general to semiconductor devices and, more particularly, to a semiconductor device and method of forming protective material between semiconductor die stacked on a semiconductor wafer to reduce defects during singulation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In a die-to-wafer (D2W) package, a plurality of semiconductor die are mounted to a surface of a semiconductor wafer. The portion of the wafer between the mounted semiconductor die is typically not supported, i.e., there is air space between the mounted die. Wafer dimples can be formed in the wafer during vacuum chuck handling, particularly in the unsupported portion of the wafer between the mounted semiconductor die. Silicon dust and other contaminants accumulate in the air space between the mounted semiconductor die and bond to the back surface of the semiconductor wafer. The semiconductor wafer is singulated with a saw blade from the back surface between the mounted semiconductor die. The cutting operation of the saw blade can cause chipping or cracking of the top, bottom, and sides of the singulated die from the wafer. The singulation damage to the top, bottom, and sides of the singulated die can cause device defects and failure.

SUMMARY OF THE INVENTION

A need exists to singulate D2W packages without damaging the singulated die. Accordingly, in one embodiment, the present invention is a method of making a semiconductor device comprising the steps of providing a semiconductor wafer containing a plurality of first semiconductor die, mounting a plurality of second semiconductor die to a first surface of the semiconductor wafer, placing a first tape on a second surface of the semiconductor wafer opposite the first surface of the semiconductor wafer, forming protective material over the second semiconductor die and first surface of the semiconductor wafer, removing the first tape, and singulating the semiconductor wafer between the second semiconductor die into individual die-to-wafer packages each containing the second semiconductor die stacked on the first semiconductor die. The protective material protects the semiconductor wafer during singulation. The method further includes the step of mounting the die-to-wafer package to a substrate, removing the protective material, and depositing an encapsulant over the die-to-wafer package and substrate.

In another embodiment, the present invention is a method of making a semiconductor device comprising the steps of providing a semiconductor wafer containing a plurality of first semiconductor die, mounting a plurality of second semiconductor die to a first surface of the semiconductor wafer, forming protective material over the second semiconductor die and first surface of the semiconductor wafer, and singulating the semiconductor wafer between the second semiconductor die into individual die-to-wafer packages each containing the second semiconductor die stacked on the first semiconductor die. The protective material protects the semiconductor wafer during singulation.

In another embodiment, the present invention is a method of making a semiconductor device comprising the steps of providing a semiconductor wafer, forming a plurality of channels in a first surface of the semiconductor wafer, depositing a protective layer over and between the channels in the first surface of the semiconductor wafer, and grinding a second surface of the semiconductor wafer opposite the first surface of the semiconductor wafer to reduce a thickness of the semiconductor wafer. The protective material protects the channels during grinding.

In another embodiment, the present invention is a semiconductor device made by a process comprising providing a semiconductor wafer containing a plurality of first semiconductor die, mounting a plurality of second semiconductor die to a first surface of the semiconductor wafer, forming protective material over the second semiconductor die and first surface of the semiconductor wafer, and singulating the semiconductor wafer between the second semiconductor die into individual die-to-wafer packages each containing the second semiconductor die stacked on the first semiconductor die. The protective material protects the semiconductor wafer during singulation.

BRIEF DESCRIPTION OF THE DRAWINGS

FIGS. 3a-3j illustrate a process of forming protective material between semiconductor die stacked on a semiconductor wafer to reduce defects during singulation;

DETAILED DESCRIPTION OF THE DRAWINGS

Figure 1:
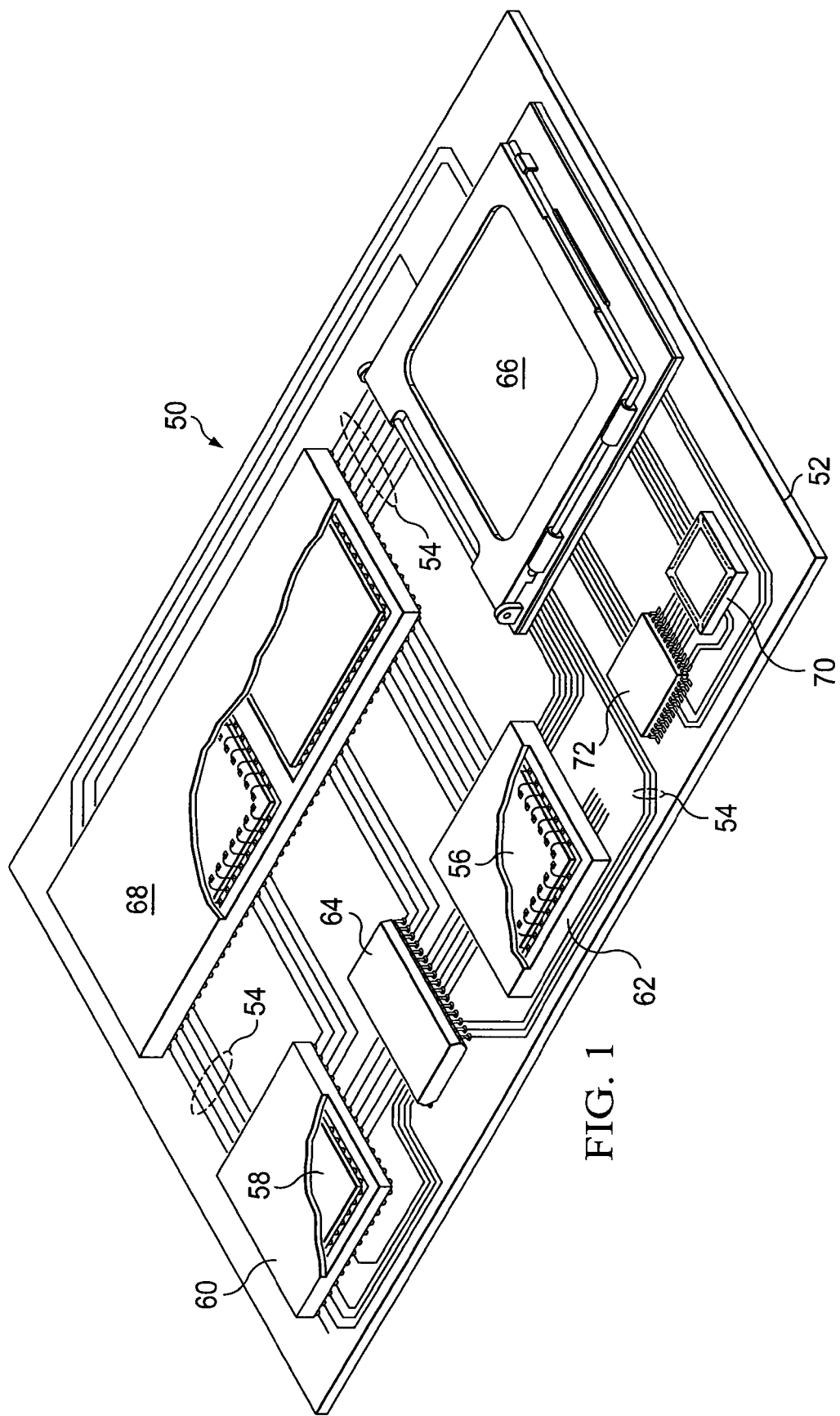
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
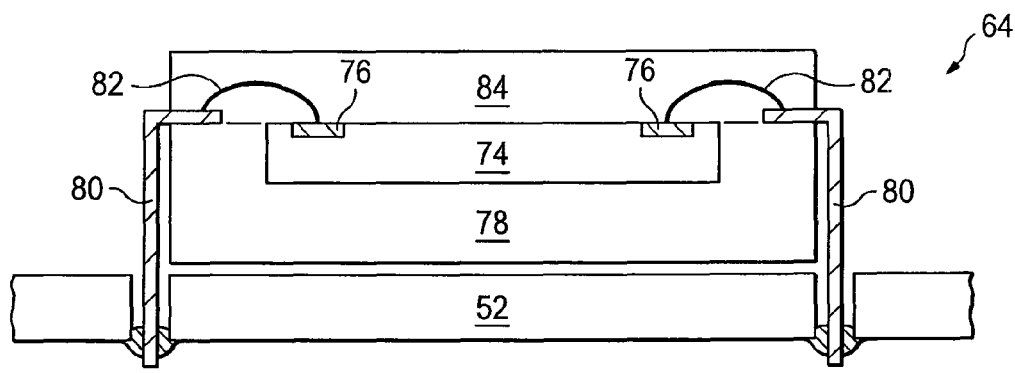
FIGS. 2a-2c illustrate further detail of the representative semiconductor packages mounted to the PCB.
Figure 2B:
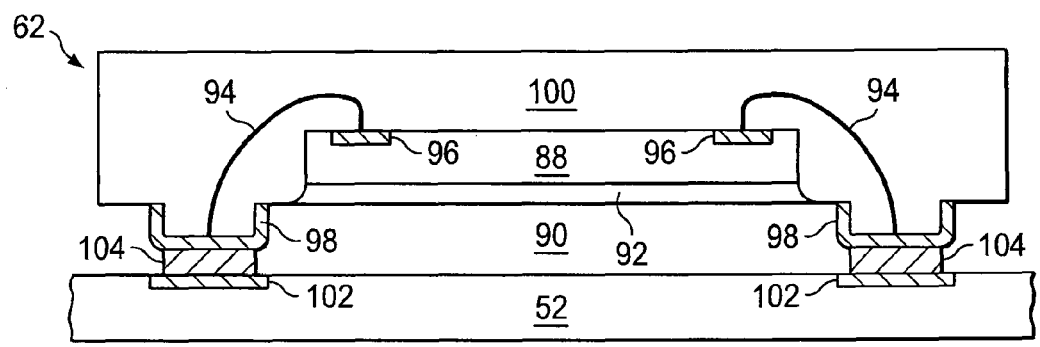
Figure 2C:
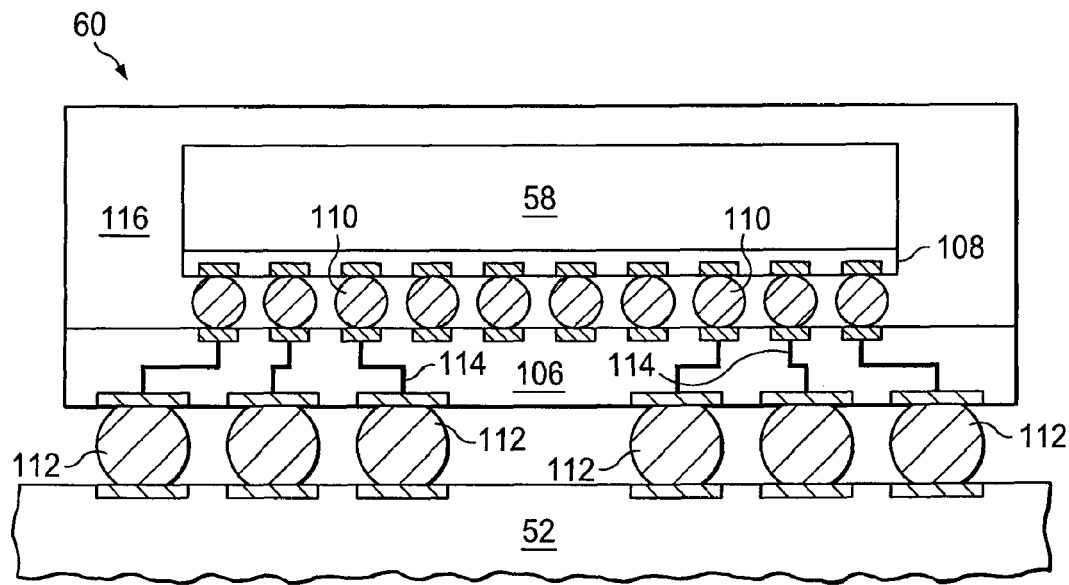

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3C:
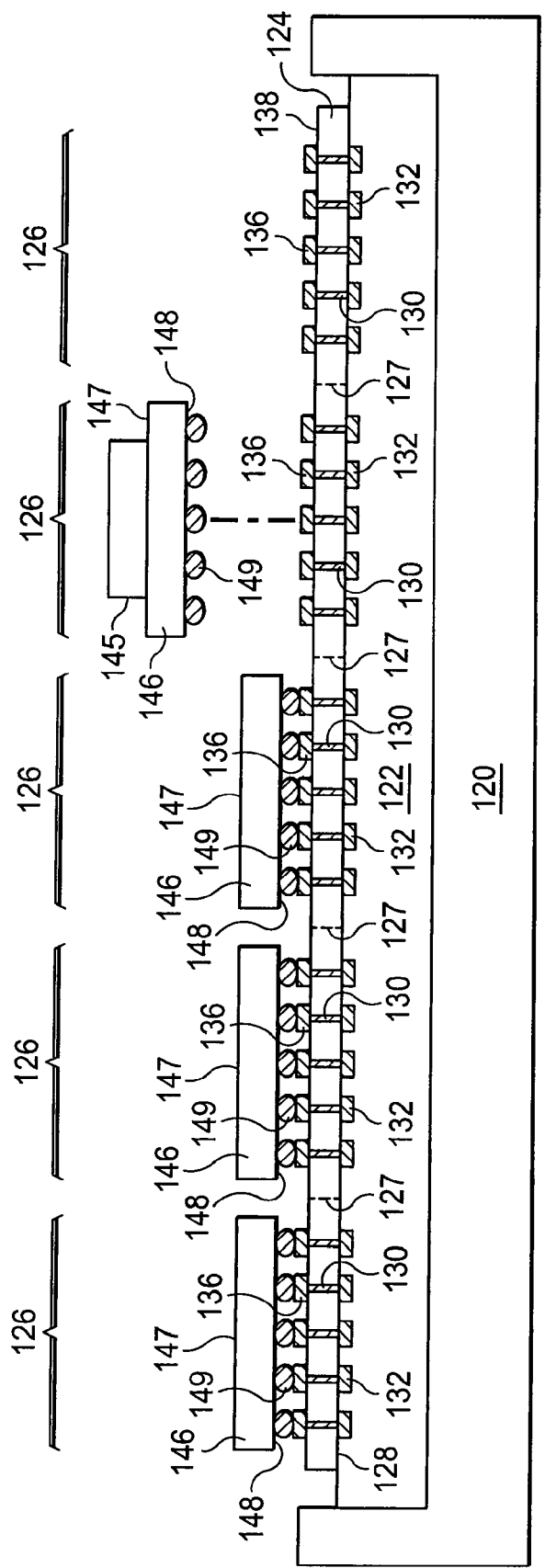

FIGS. 3a-3j illustrate, in relation to FIGS. 1 and 2a-2c, a process of forming protective material between a semiconductor die stacked on a semiconductor wafer to reduce defects during singulation. In FIG. 3a, a tape 122 is placed in wafer level chip attach device or wafer jig 120. Tape 122 can be a polymer adhesive which is deposited using by spin coating or printing and releasable by light, heat or laser. Alternatively, tape 122 can be thermal epoxy, laminated polymer, polymer composite, or inorganic bonding compound.

A semiconductor wafer 124 is positioned over tape 122. Semiconductor wafer 124 contains a base substrate material such as silicon, germanium, gallium arsenide, indium phosphide, or silicon carbide, for structural support. A plurality of semiconductor die or components 126 are formed on wafer 124 separated by saw streets 127 as described above. Each semiconductor die 126 includes an active surface 128 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, memory, or other signal processing circuit. Semiconductor die 126 may also contain IPDs, such as inductors, capacitors, and resistors, for RF signal processing. A typical RF system requires multiple IPDs in one or more semiconductor packages to perform the necessary electrical functions.

Figure 4A:
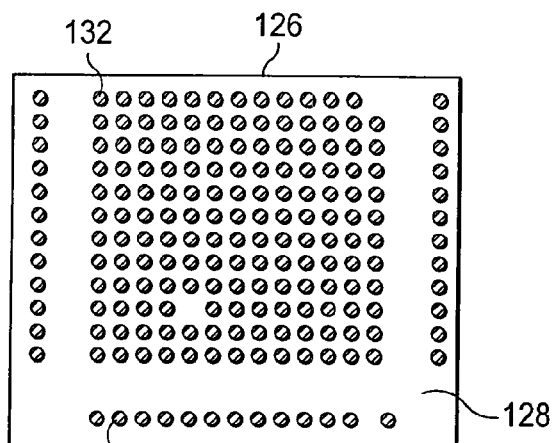
FIGS. 4a-4c illustrate further detail of the interconnect structure on the semiconductor die and wafer.
Figure 4B:
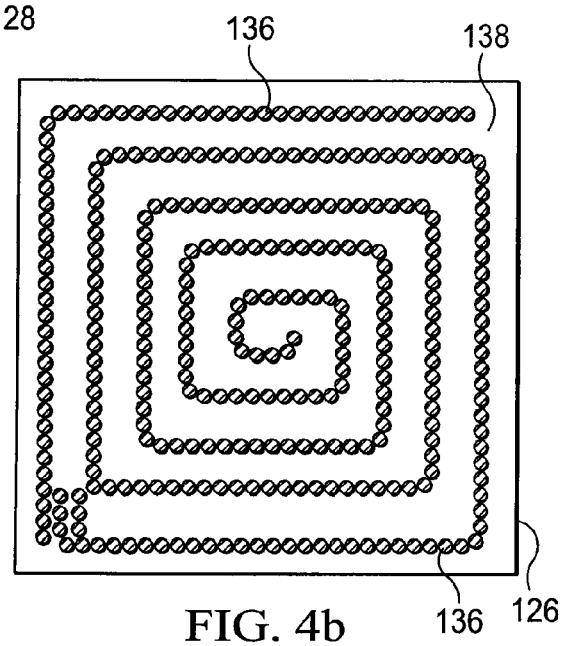

A plurality of vias is formed through semiconductor die 126 using laser drilling or etching process, such as deep reactive ion etching (DRIE). The vias are filled with Al, Cu, Sn, Ni, Au, Ag, titanium (Ti), W, poly-silicon, or other suitable electrically conductive material using PVD, CVD, electrolytic plating, electroless plating, or other suitable metal deposition process to form conductive through silicon vias (TSV) 130. A plurality of bumps or interconnects 132 are formed over TSV 130 on active surface 128 of semiconductor die 126. FIG. 4a shows further detail of interconnects 132 formed over TSV 130 on active surface 128 of semiconductor die 126. A plurality of bumps or interconnects 136 are formed over TSV 130 on back surface 138 of semiconductor wafer 124. FIG. 4b shows further detail of individual interconnects 136 formed in spiral arrangement over TSV 130 on back surface 138 of semiconductor die 126.

In FIG. 3b, semiconductor wafer 124 is mounted to tape 122 in wafer jig 120. Active surface 128 of semiconductor wafer 124 contacts tape 122 with bumps or interconnects 132 embedded in the tape.

Figure 4C:
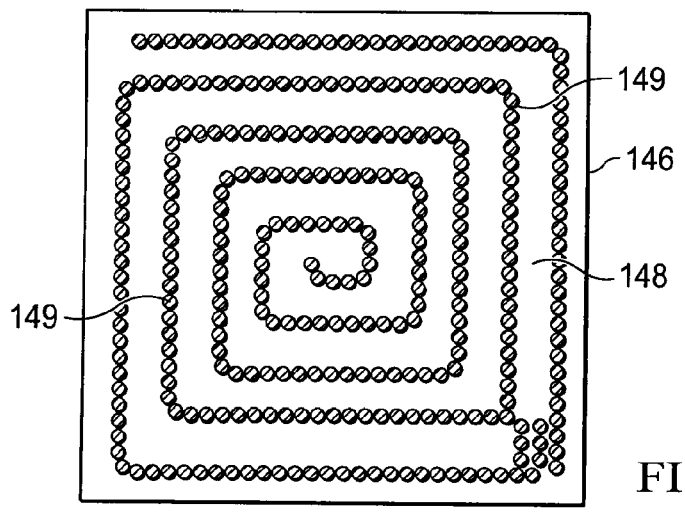

In FIG. 3c, semiconductor die or component 146 are mounted to back surface 138 of semiconductor wafer 124 using pick and place tool 145. In one embodiment, pick and place tool 145 is a computer controlled vacuum chuck attached to back surface 147 of semiconductor die 146. Each semiconductor die 146 has an active surface 148 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 148 to implement analog circuits or digital circuits, such as DSP, ASIC, memory, or other signal processing circuit. Semiconductor die 146 may also contain IPDs, such as inductors, capacitors, and resistors, for RF signal processing. Bumps 149 on semiconductor die 146 align with interconnects 136 to electrically connect the circuits on semiconductor die 146 to circuits on corresponding semiconductor die 124 through interconnects 132 and 136 and TSV 130. FIG. 4c shows further detail of individual interconnects 149 formed over active surface 148 of semiconductor die 146.

Figure 3D:
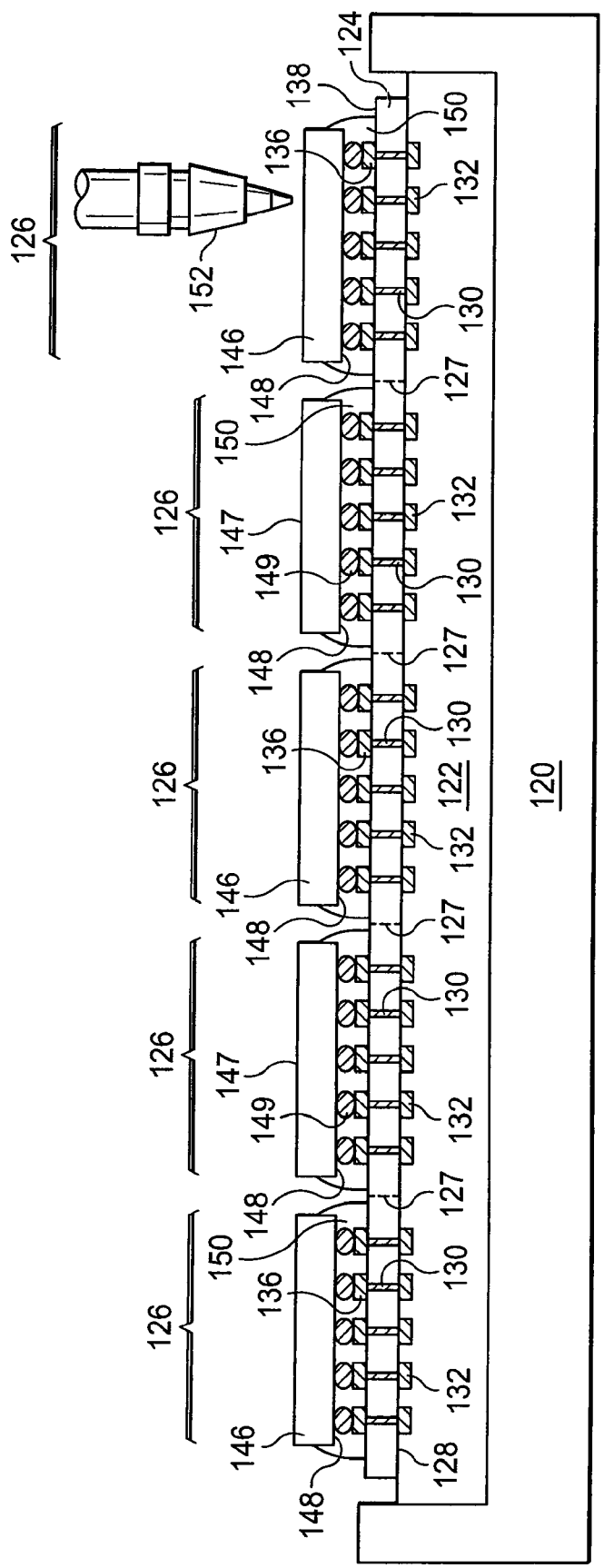

In FIG. 3d, an underfill material 150, such as epoxy, polymeric material, film, or other non-conductive material, is deposited beneath semiconductor die 146 using dispensing tool 152.

Figure 3E:
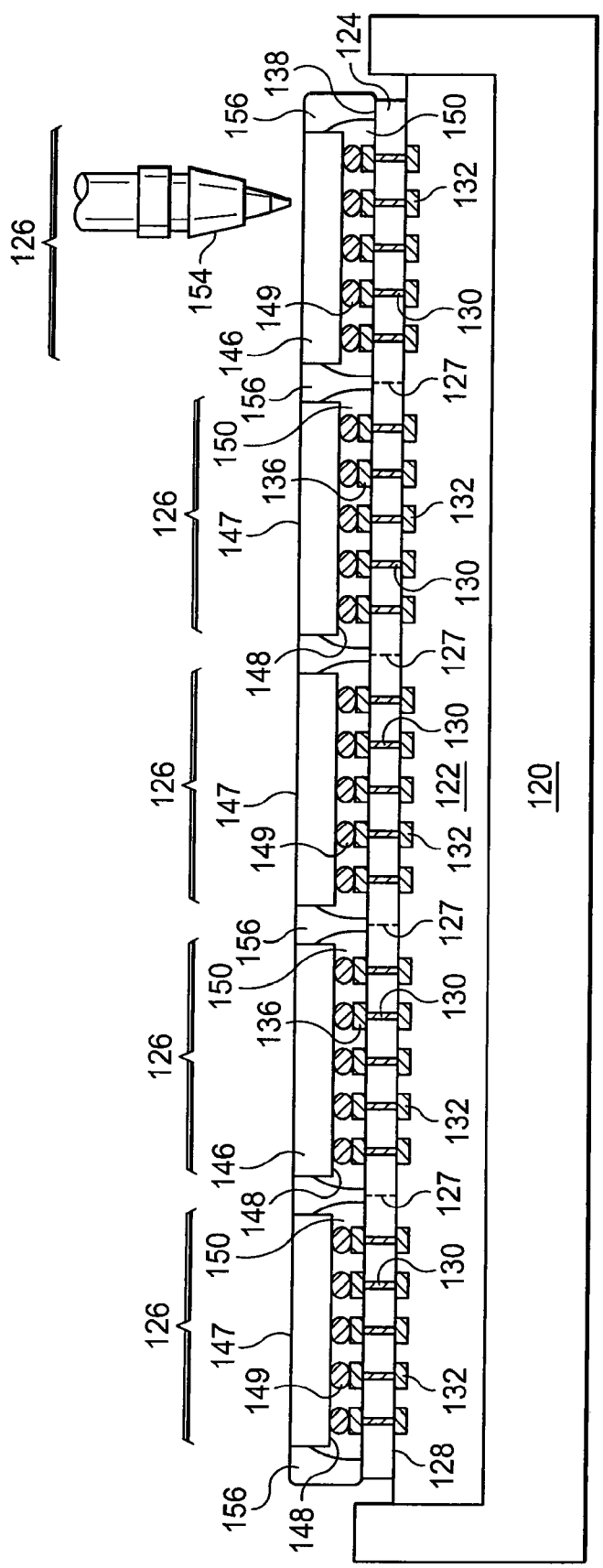

In FIG. 3e, a coating or protective material 156 is deposited over semiconductor die 146 and semiconductor wafer 124. Protective material 156 is water-soluble and dries at room temperature. In one embodiment, protective material 156 contains polyvinyl alcohol and water. Protective material 156 is deposited by dispenser 154 and spin coating or other suitable applicator.

In FIG. 3f, the assembly described in FIG. 3a-3e is removed from wafer jig 120 and mounted with back surface 147 and protective material 156 to dicing tape 158.

In FIG. 3g, tape 122 is removed by heat, light, or laser to expose interconnects 132. The assembly undergoes a dicing operation with 2 millimeter (mm) by 120 micrometer (μm) gaps using saw blade or laser cutting tool 160 to singulate wafer 124 into individual stacked semiconductor die 126 and 146. Semiconductor die 126 and 146 are different size die. In one embodiment, semiconductor die 146 is 4 mm by 4 mm, and semiconductor die 126 is 6 mm by 6 mm. Protective material 156 supports semiconductor wafer 124 to reduce wafer dimpling. In addition, protective material 156 protects semiconductor wafer 124 so that the cutting operation of saw blade 160 leaves smooth die edges and reduces wafer chipping or cracking during the singulation. Protective material 156 also seals the area between semiconductor die 146 and prevents accumulation of contaminants on semiconductor wafer 124.

Figure 3H:
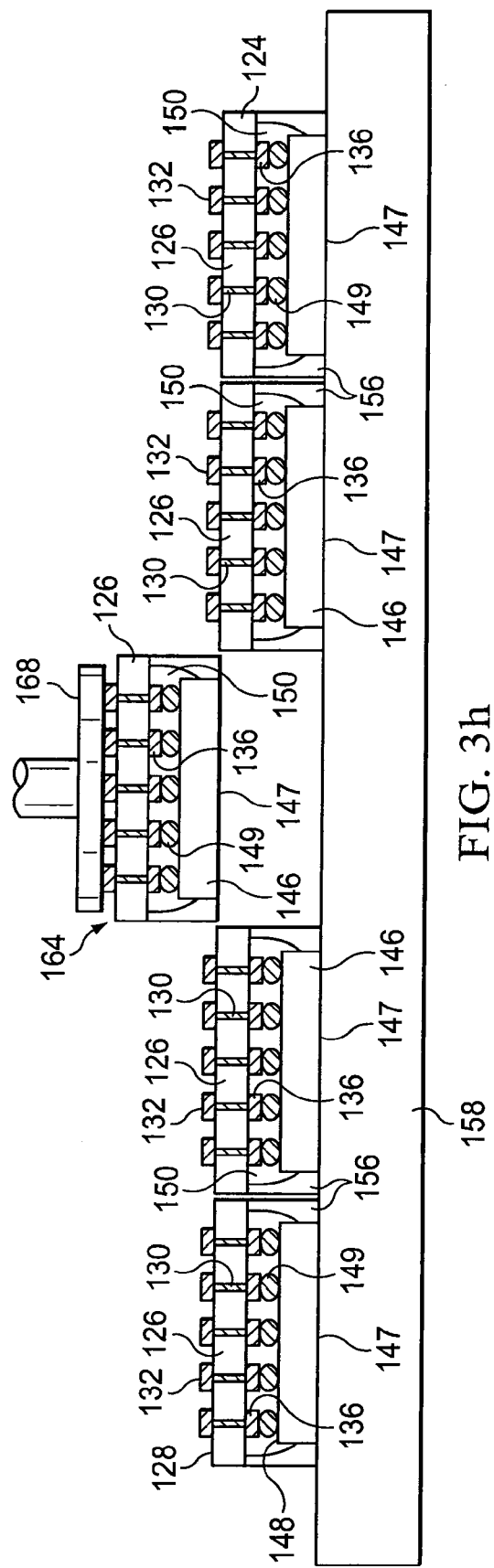

In FIG. 3h, die assemblies 164, each containing stacked semiconductor die 126 and 146, are removed from tape 158 with pick and place tool 168 contacting interconnects 132.

Figure 3I:
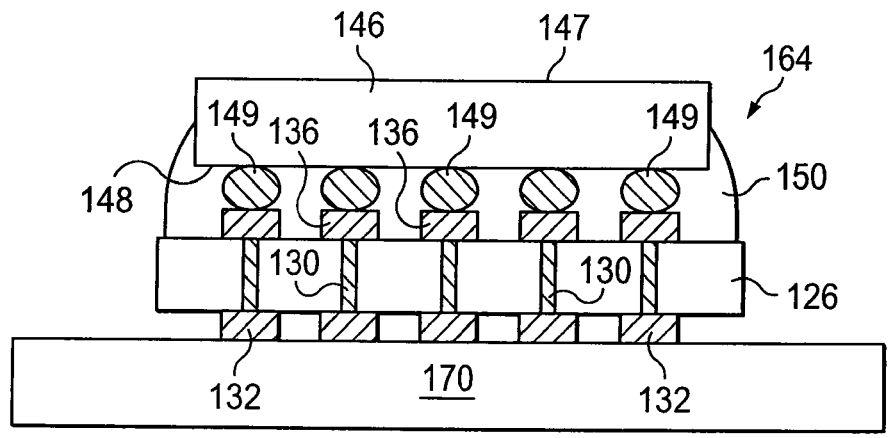
Figure 3J:
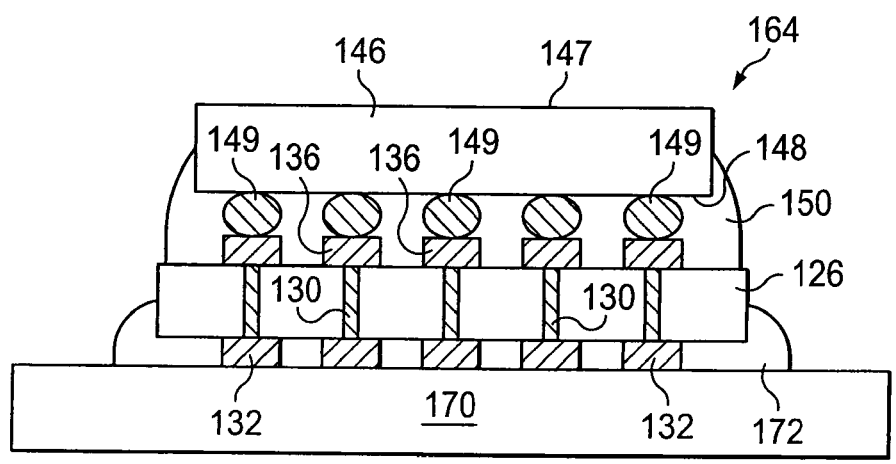

In FIG. 3i, D2W package 164 is mounted to substrate 170 with interconnects 132 oriented toward the substrate. D2W package 164 is cleaned with deionized water to remove protective material 156, contaminants, debris, and other excess material. An underfill material 172, such as epoxy, polymeric material, film, or other non-conductive material, is deposited beneath semiconductor die 146 using the dispensing tool, as shown in FIG. 3j. In D2W package 164, semiconductor die 146 is electrically connected to semiconductor die 126 through TSV 130 and interconnects 132 and 136. The sides of semiconductor die 126 are relatively smooth and defect-free because protective material 156 protects semiconductor wafer 124 during singulation.

Figure 5:
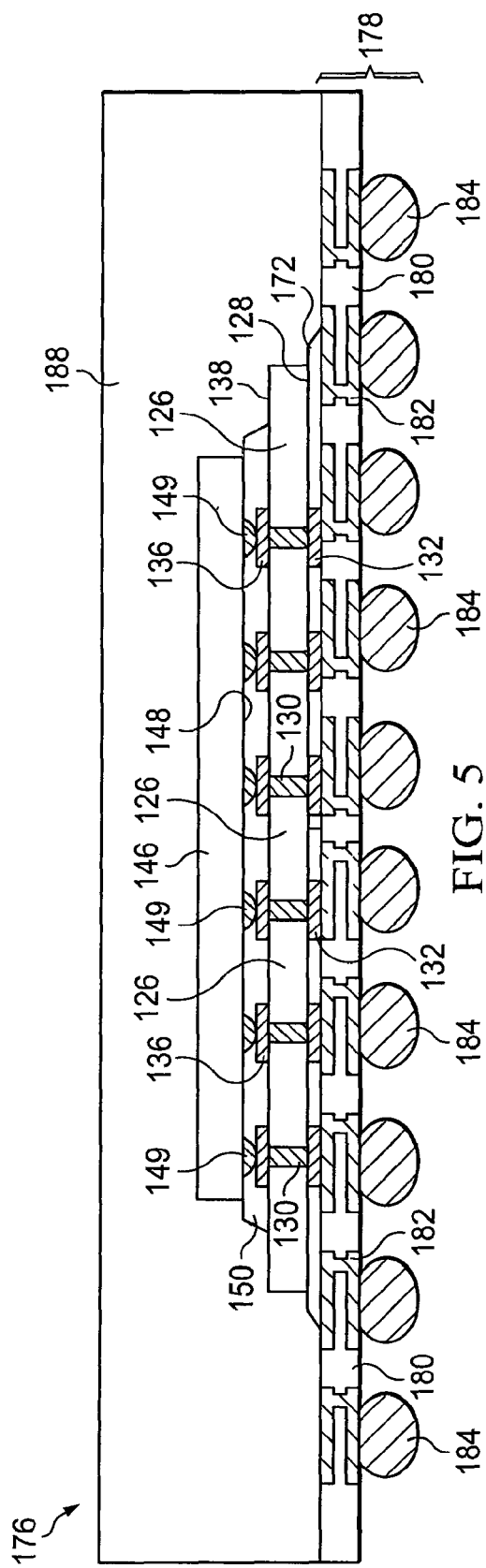
FIG. 5 illustrates the D2W package with build-up interconnect structure.

FIG. 5 shows an alternate embodiment with D2W package 176, formed similar to the process described in FIGS. 3a-3j, having a bottom-side build-up interconnect structure 178. An insulating or passivation layer 180 is deposited as one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 180 is formed using PVD, CVD, printing, spin coating, spray coating, sintering or thermal oxidation. A portion of insulating layers 180 is removed by an etching process. Conductive layer 182 is formed as one or more layers in the removed portions of insulating layer 180 using patterning with PVD, CVD, sputtering, electrolytic plating, electroless plating, or other suitable metal deposition process. Conductive layer 182 can be one or more layers of Al, Cu, Sn, Ni, Au, Ag, or other suitable electrically conductive material. A portion of conductive layer 182 is electrically connected to interconnects 132. Other portions of conductive layer 182 can be electrically common or electrically isolated depending on the design and function of the semiconductor device.

An electrically conductive bump material is deposited over build-up interconnect structure 178 and electrically connected to conductive layer 182 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 182 using a suitable attachment or bonding process. In one embodiment, the bump material is ref lowed by heating the material above its melting point to form spherical balls or bumps 184. In some applications, bumps 184 are ref lowed a second time to improve electrical contact to conductive layer 182. The bumps can also be compression bonded to conductive layer 182. Bumps 184 represent one type of interconnect structure that can be formed over conductive layer 182. The interconnect structure can also use bond wires, stud bump, micro bump, or other electrical interconnect.

An encapsulant or molding compound 188 is deposited over semiconductor die 126, semiconductor die 146, and build-up interconnect structure 178 using a paste printing, compressive molding, transfer molding, liquid encapsulant molding, spin coating, vacuum lamination, or other suitable applicator. In one embodiment, encapsulant 188 is deposited using a chase mold. Encapsulant 188 can be polymer composite material, such as epoxy resin with filler, epoxy acrylate with filler, or polymer with proper filler. Encapsulant 188 is non-conductive and environmentally protects the semiconductor device from external elements.

Semiconductor die 146 is electrically connected to semiconductor die 126 through TSV 130 and interconnects 132 and 136. D2W package 176 is electrically connected to external devices through build-up interconnect structure 178. The sides of semiconductor die 126 are relatively smooth and defect-free because protective material 156 protects semiconductor wafer 124 during singulation.

Figure 6A:
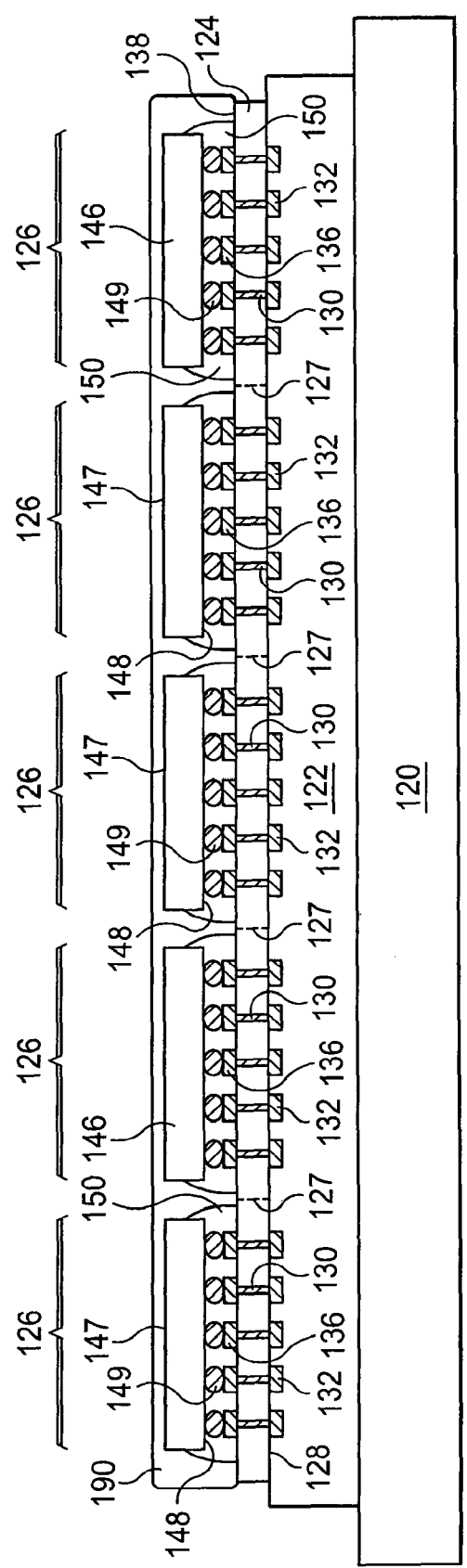
FIGS. 6a-6e illustrate another process of forming protective material between semiconductor die stacked on a semiconductor wafer to reduce defects during singulation.

FIGS. 6a-6e illustrate, in relation to FIGS. 1 and 2a-2c, another process of depositing protective material between a semiconductor die stacked on a semiconductor wafer to reduce defects during singulation. Continuing with the embodiment from FIG. 3d, an encapsulant or molding compound 190 is deposited as protective material over semiconductor die 146 and semiconductor wafer 124, as shown in FIG. 6a, using a paste printing, compressive molding, transfer molding, liquid encapsulant molding, spin coating, vacuum lamination, or other suitable applicator. Encapsulant 190 can be polymer composite material, such as epoxy resin with filler, epoxy acrylate with filler, or polymer with proper filler.

Figure 6B:
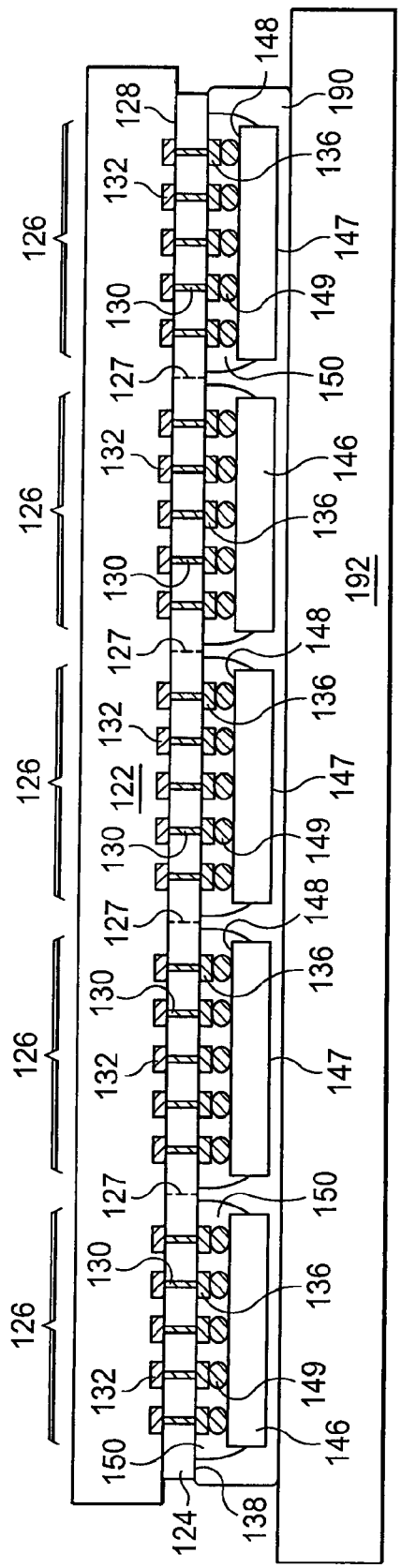

In FIG. 6b, the assembly from FIG. 6a is removed from wafer jig 120 and mounted with encapsulant 190 to dicing tape 192.

Figure 6C:
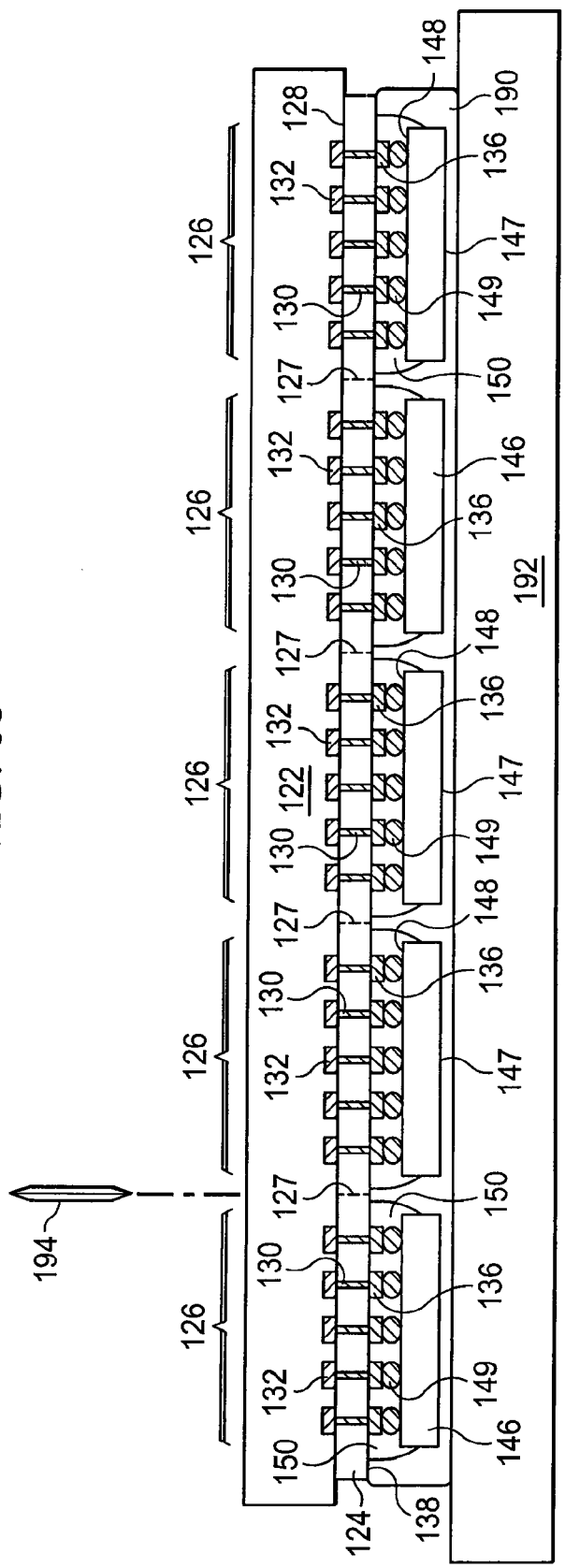

In FIG. 6c, tape 122 is removed by heat, light, or laser to expose interconnect 132. The assembly undergoes a dicing operation with 2 mm by 120 µm gaps using saw blade or laser cutting tool 194 to singulate wafer 124 into individual stacked semiconductor die 126 and 146. Encapsulant 190 supports semiconductor wafer 124 to reduce wafer dimpling. In addition, encapsulant 190 acts as protective material on semiconductor wafer 124 so that the cutting operation of saw blade 160 leaves smooth die edges and reduces wafer chipping or cracking during the singulation. The encapsulant 190 also seals the area between semiconductor die 146 and prevents accumulation of contaminants on semiconductor wafer 124.

Figure 6D:
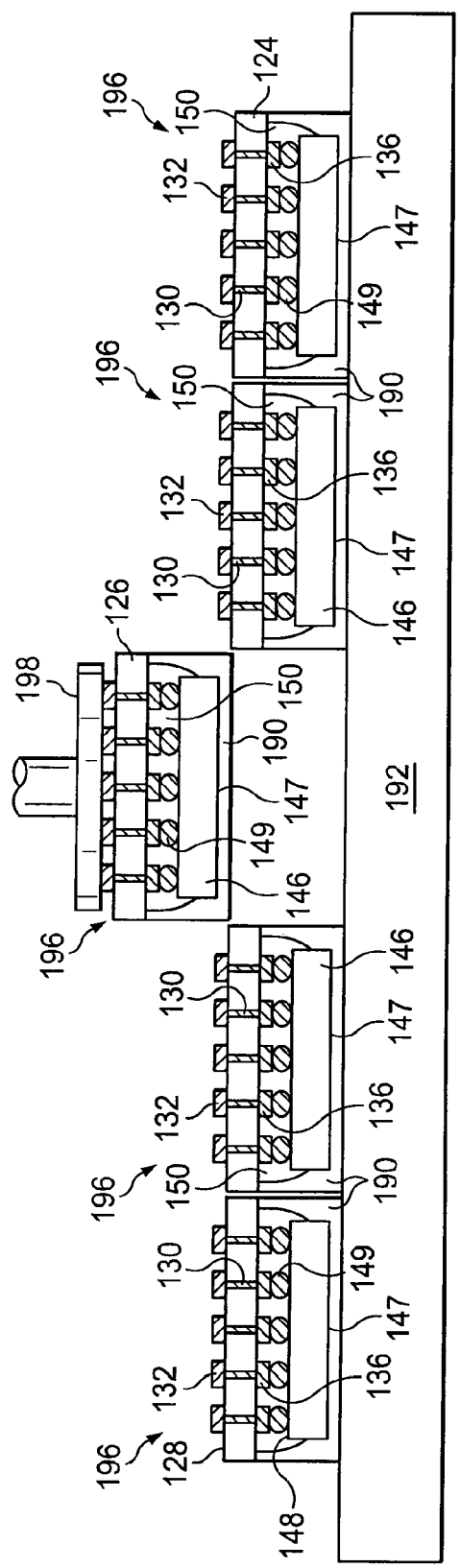

In FIG. 6d, die assemblies 196, each containing stacked semiconductor die 126 and 146, are removed from tape 192 with pick and place tool 198 contacting interconnects 132.

Figure 6E:
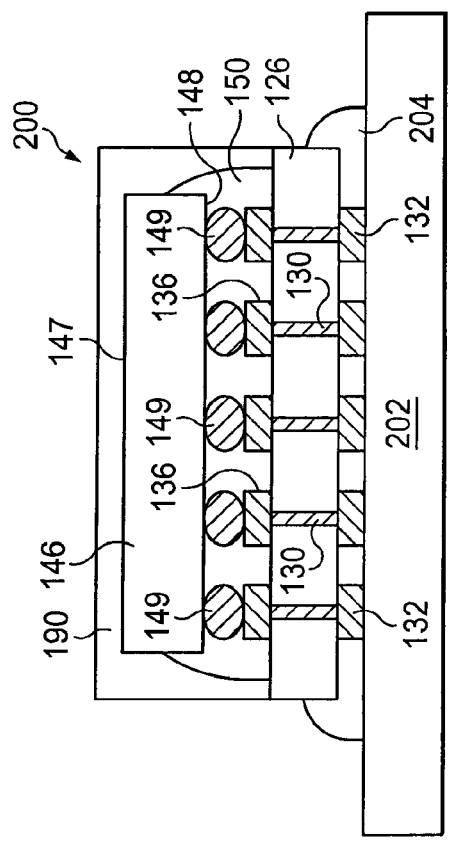

In FIG. 6e, D2W package 200 is mounted to substrate 202 with interconnects 132 oriented toward the substrate. An underfill material 204, such as epoxy, polymeric material, film, or other non-conductive material, is deposited beneath semiconductor die 146 using the dispensing tool. In D2W package 200, semiconductor die 146 is electrically connected to semiconductor die 126 through TSV 130 and interconnects 132 and 136. The sides of semiconductor die 126 are relatively smooth and defect-free because encapsulant 190 protects semiconductor wafer 124 during singulation.

Figure 7A:
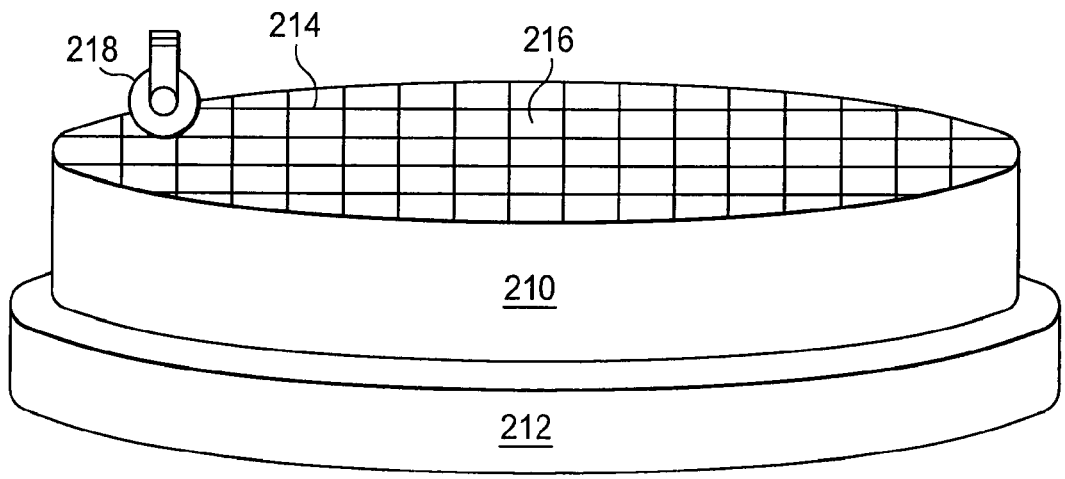
FIGS. 7a-7e illustrate protective material deposited over channels formed in a semiconductor wafer to protect the channels during back grinding.
Figure 7B:
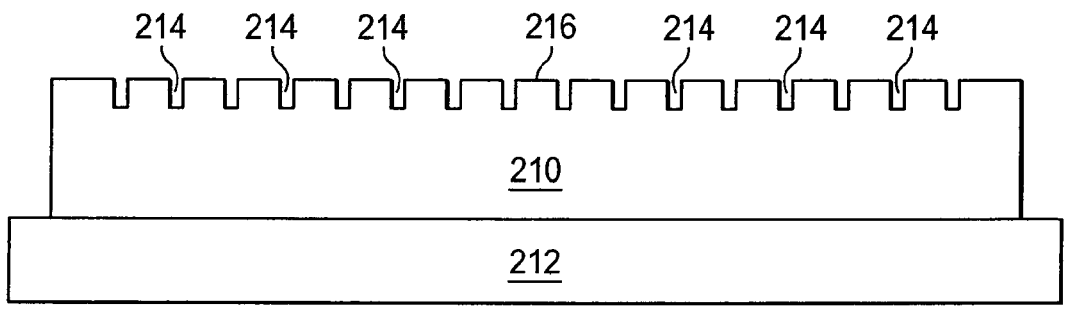

In another embodiment, protective material is deposited over channels formed in a surface of a semiconductor wafer, as shown in FIGS. 7a-7e. FIG. 7a shows semiconductor wafer 210 placed on grinder platform 212. A plurality of grooves or channels 214 is formed in top surface 216 of semiconductor wafer 210 by cutting wheel 218. The grooving depth is 30-50% of a target wafer thickness after a back grinding operation. For example, if the target wafer thickness after the back grinding operation is 25 µm, then the channel depth is 10 µm. FIG. 7b shows further detail of channels 214 formed in top surface 216 of semiconductor wafer 210. Channels 214 are weak points of semiconductor wafer 210 and may lead to wafer breakage or damage during the back grinding operation.

Figure 7C:
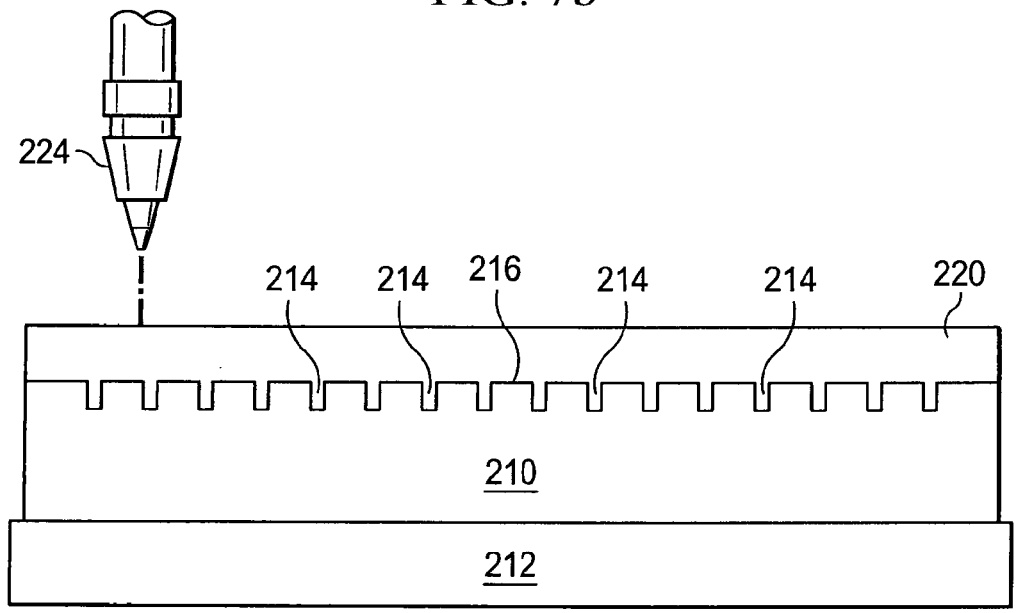

In FIG. 7c, protective material 220 is deposited over and between channels 214 on top surface 216 of semiconductor wafer 210. Protective material 220 is water-soluble and dries at room temperature. In one embodiment, protective material 220 contains polyvinyl alcohol and water. Protective material 220 is deposited by dispenser 224 and spin coating or other suitable applicator.

Figure 7D:
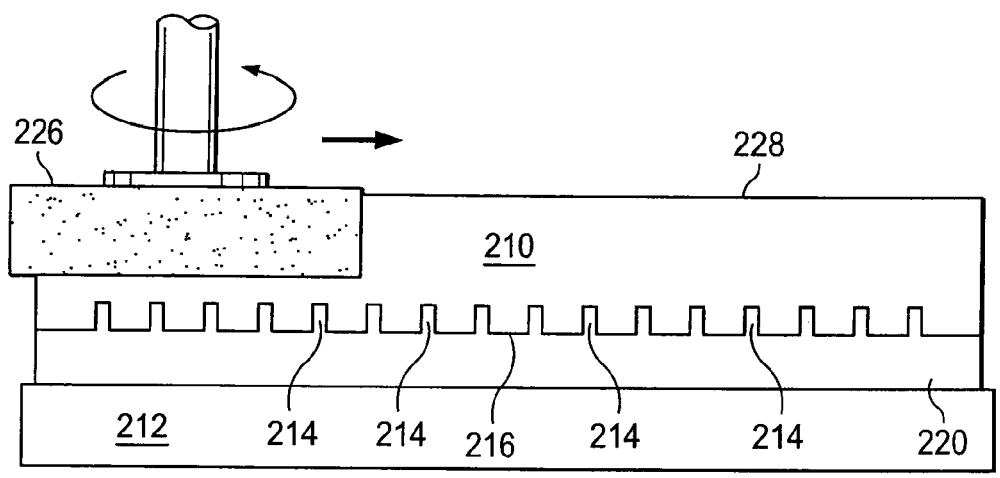

In FIG. 7d, semiconductor wafer 210 is inverted so that protective material 220 is oriented facing grinder platform 212. Grinder 226 removes a portion of back surface 228 of semiconductor wafer approximately down to protective material 220. Protective material 220 prevents damage to top surface 216 and channels 214 during the grinding process.

Figure 7E:
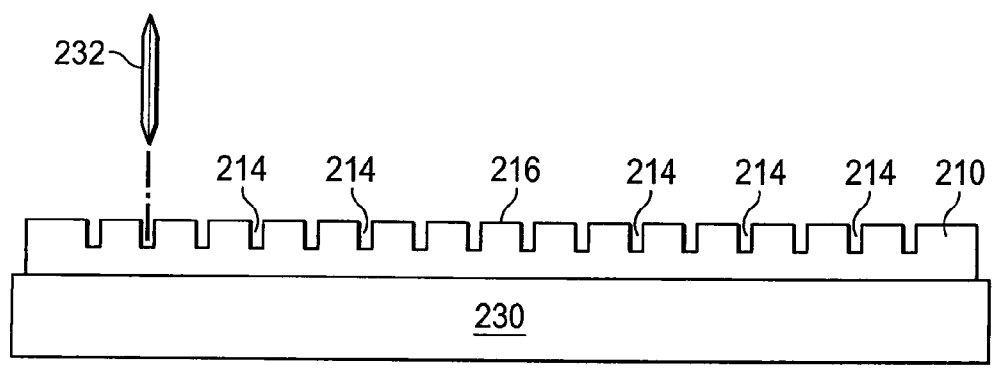

In FIG. 7e, post-grinding semiconductor wafer 210 is mounted to dicing tape 230 and protective material 220 and other excess material are removed with deionized water. Semiconductor wafer is singulated with saw blade or laser cutting tool 232.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer containing a plurality of first semiconductor die;
   mounting a plurality of second semiconductor die to a first surface of the semiconductor wafer;
   placing a tape on a second surface of the semiconductor wafer opposite the first surface of the semiconductor wafer;
   forming a protective material over the second semiconductor die and first surface of the semiconductor wafer;
   singulating the semiconductor wafer between the second semiconductor die into individual die-to-wafer packages each containing the second semiconductor die stacked on the first semiconductor die, the protective material protecting the semiconductor wafer during singulation;
   removing the tape;
   mounting the die-to-wafer package to a substrate;
   removing the protective material to expose the second semiconductor die and first surface of the semiconductor wafer; and
   depositing an encapsulant over the die-to-wafer package and substrate.

2. The method of claim 1, further including forming a plurality of conductive vias through the semiconductor wafer.

3. The method of claim 1, wherein the protective material includes polyvinyl alcohol and water.

4. The method of claim 1, further including depositing underfill material beneath the first semiconductor die.

5. The method of claim 1, further including depositing underfill material beneath the second semiconductor die.

6. The method of claim 1, wherein the substrate includes a build-up interconnect structure.

7. A method of making a semiconductor device, comprising:
   providing a semiconductor wafer containing a plurality of first semiconductor die;
   mounting a plurality of second semiconductor die to a surface of the semiconductor wafer;
   forming a protective material over the second semiconductor die and surface of the semiconductor wafer;
   singulating the semiconductor wafer between the second semiconductor die into individual die-to-wafer packages each containing the second semiconductor die stacked on the first semiconductor die, the protective material protecting the semiconductor wafer during singulation; and
   removing the protective material to expose the second semiconductor die and surface of the semiconductor wafer.

8. The method of claim 7, wherein the protective material includes polyvinyl alcohol and water.

9. The method of claim 7, wherein the protective material includes encapsulant.

10. The method of claim 7, further including:
    forming a build-up interconnect structure over the first semiconductor die; and
    depositing an encapsulant over the first semiconductor die, second semiconductor die, and build-up interconnect structure.

11. The method of claim 7, further including mounting the die-to-wafer package to a substrate.

12. The method of claim 7, further including forming a plurality of conductive vias through the semiconductor wafer.

13. The method of claim 7, further including:
    depositing first underfill material beneath the first semiconductor die; and
    depositing second underfill material beneath the second semiconductor die.

14. A method of making a semiconductor device, comprising:
    providing a semiconductor wafer;
    forming a plurality of channels in a first surface of the semiconductor wafer;
    depositing a protective layer over and between the channels in the first surface of the semiconductor wafer;
    grinding a second surface of the semiconductor wafer opposite the first surface of the semiconductor wafer to reduce a thickness of the semiconductor wafer, the protective layer protecting the channels during grinding; and
    removing the protective layer to expose the channels in the first surface of the semiconductor wafer.

15. The method of claim 14, further including removing the protective layer with deionized water.

16. The method of claim 14, further including singulating the semiconductor wafer.

17. The method of claim 14, wherein the protective layer includes polyvinyl alcohol and water.

18. The method of claim 14, further including forming a plurality of conductive vias through the semiconductor wafer.

19. A method of making a semiconductor device, comprising:
    providing a semiconductor wafer having a plurality of semiconductor die;
    forming a plurality of channels in a first surface of the semiconductor wafer between the semiconductor die;
    depositing a protective material over the first surface of the semiconductor wafer and the channels;
    grinding a second surface of the semiconductor wafer to remove a portion of the semiconductor wafer; and
    removing the protective material to expose the first surface of the semiconductor wafer and the channels.

20. The method of claim 19, wherein grinding the second surface of the semiconductor wafer further includes singulating the semiconductor wafer between the semiconductor die.

21. The method of claim 19, wherein forming the plurality of channels in the first surface of the semiconductor wafer includes forming the channels at a depth of 30-50 percent of a reduced thickness of the semiconductor wafer.

22. The method of claim 19, wherein the protective material is a water-soluble material.

23. The method of claim 19, wherein the protective material includes polyvinyl alcohol and water.

24. The method of claim 19, further including forming a plurality of conductive vias through the semiconductor wafer.

25. The method of claim 7, wherein removing the protective material exposes the surface of the semiconductor wafer.

* * * * *